United States Patent
Kitayama et al.

(10) Patent No.: US 10,644,409 B2
(45) Date of Patent: May 5, 2020

(54) PASSIVE ELEMENT

(71) Applicant: NIPPON TELEGRAPH AND TELEPHONE CORPORATION, Tokyo (JP)

(72) Inventors: Daisuke Kitayama, Tokyo (JP); Makoto Yaita, Tokyo (JP); Ho-Jin Song, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 65 days.

(21) Appl. No.: 16/066,658

(22) PCT Filed: Dec. 22, 2016

(86) PCT No.: PCT/JP2016/088372
§ 371 (c)(1),
(2) Date: Jun. 27, 2018

(87) PCT Pub. No.: WO2017/115718
PCT Pub. Date: Jul. 6, 2017

(65) Prior Publication Data
US 2019/0027803 A1    Jan. 24, 2019

(30) Foreign Application Priority Data

Dec. 28, 2015 (JP) ................. 2015-256275

(51) Int. Cl.
*H01Q 15/10* (2006.01)
*H01P 7/08* (2006.01)
(Continued)

(52) U.S. Cl.
CPC ............. *H01Q 15/10* (2013.01); *H01P 1/18* (2013.01); *H01P 7/08* (2013.01); *H01Q 15/0033* (2013.01);
(Continued)

(58) Field of Classification Search
CPC ........ H01P 7/08; H01P 1/18; H01Q 15/0033; H01Q 15/0046; H01Q 15/0086;
(Continued)

(56) References Cited

U.S. PATENT DOCUMENTS 6,791,432 B2 *  9/2004  Smith .................... H01Q 1/364
                                                              333/219
8,648,306 B1    2/2014  Goertz et al.
(Continued)

FOREIGN PATENT DOCUMENTS

CN        102124382 A      7/2011
JP        2012-510637 A    5/2012
(Continued)

OTHER PUBLICATIONS

Machine English Translation of JP2015-231184 Published on Dec. 21, 2015 (Year: 2015).*
(Continued)

*Primary Examiner* — Rakesh B Patel
*Assistant Examiner* — Jorge L Salazar, Jr.
(74) *Attorney, Agent, or Firm* — Womble Bond Dickinson (US) LLP (57) ABSTRACT

A split ring resonator (10) as a unit cell of a passive element includes a conductor (1) made of a metal and having an annular shape split by a first gap (2) and a second gap (3) different from the first gap (2). A first capacitance generated by the first gap (2) is different from a second capacitance generated by the second gap (3).

8 Claims, 12 Drawing Sheets

(51) Int. Cl.
  *H01Q 15/00* (2006.01)
  *H01P 1/18* (2006.01)
  *H03C 7/02* (2006.01)
  *H01Q 3/44* (2006.01)
  *G02B 1/00* (2006.01)
  *G02B 5/30* (2006.01)

(52) U.S. Cl.
  CPC ..... *H01Q 15/0046* (2013.01); *H01Q 15/0086* (2013.01); *H03C 7/02* (2013.01); *G02B 1/007* (2013.01); *G02B 5/3025* (2013.01); *H01Q 3/44* (2013.01)

(58) Field of Classification Search
  CPC . H01Q 15/10; H01Q 3/44; H03C 7/02; G02B 5/3025; G02B 1/007
  USPC ....... 333/24 R, 219, 236; 343/867; 455/41.1, 455/41.2
  See application file for complete search history.

(56) References Cited

U.S. PATENT DOCUMENTS

2010/0232017 A1   9/2010  McCarthy et al.
2012/0309316 A1* 12/2012  Edwards .............. H04B 5/0031
                                                                 455/41.2

FOREIGN PATENT DOCUMENTS

JP    2015-231184 A    12/2015
WO   2010/036290 A2    4/2010
WO   2010/039301 A2    4/2010

OTHER PUBLICATIONS

Office Action received for Japanese Patent Application No. 2015-256275, dated Dec. 10, 2018, 6 pages (3 pages of English Translation and 3 pages of Original Document).

International Preliminary Report on Patentability received for PCT Application No. PCT/JP2016/088372, dated Jul. 12, 2018, 9 pages (5 pages of English Translation and 4 pages of Original Document).

Shin et al., "A 108-112 GHz 4×4 Wafer-Scale Phased Array Transmitter with High-Efficiency On-Chip Antennas", IEEE Journal of Solid-State Circuits, vol. 48, No. 9, Sep. 2013, pp. 2041-2055.

Kitayama et al., "Laminated metamaterial flat lens at millimeter-wave frequencies", Optics Express, vol. 23, No. 18, 2015, pp. 23348-23356.

International Search Report and Written Opinion received for PCT Patent Application No. PCT/JP2016/088372, dated Mar. 21, 2017, 9 pages (4 pages of English Translation and 5 pages of Original Document).

* cited by examiner

PASSIVE ELEMENT

TECHNICAL FIELD

The present invention relates to a metamaterial passive element using a split ring resonator.

BACKGROUND ART

The application of millimeter wave/terahertz waves to imaging and radar technology has been hoped for as the wave can transmit through a material and has a high resolution. Since the wavelength is of submillimeter order, the antenna size can be reduced to submillimeter order. An on-chip antenna formed by integrating antennas in a silicon Integrated Circuit (IC) has been extensively studied. However, a transmission loss in a circuit is relatively large because of the high frequency, and thus a technique to suppress a transmission loss in a circuit in the millimeter wave/terahertz wave band is needed. For example, non-patent literature 1 discloses, when a 4×4 planar array antenna is used at a frequency of 100 GHz or higher, an ohmic loss of 10 dB or greater occurs in a power supply network to the antenna formed by a divider and the like.

Metamaterial technology that can control propagation of an ultra-high frequency signal in a space system by designing the refractive index of a material is hoped to realize an ultra-high frequency band space system device. For example, according to non-patent literature 2, the dimension of a gap of a split ring resonator is changed using the split ring resonator to serve as a unit cell of a metamaterial device, so as to shift a resonance frequency. This shift in resonance frequency allows a transmission phase amount to change in a frequency region that exhibits a transmission characteristic with a low loss, thereby controlling propagation of electromagnetic waves transmitted through the metamaterial device. As described above, as a method of forming an ultra-high frequency wave front with a high transmission loss in the circuit, a technique of forming the wave front of an electromagnetic wave in the space system device rather than in the circuit is effective in terms of suppression of a transmission loss.

Figure 9:
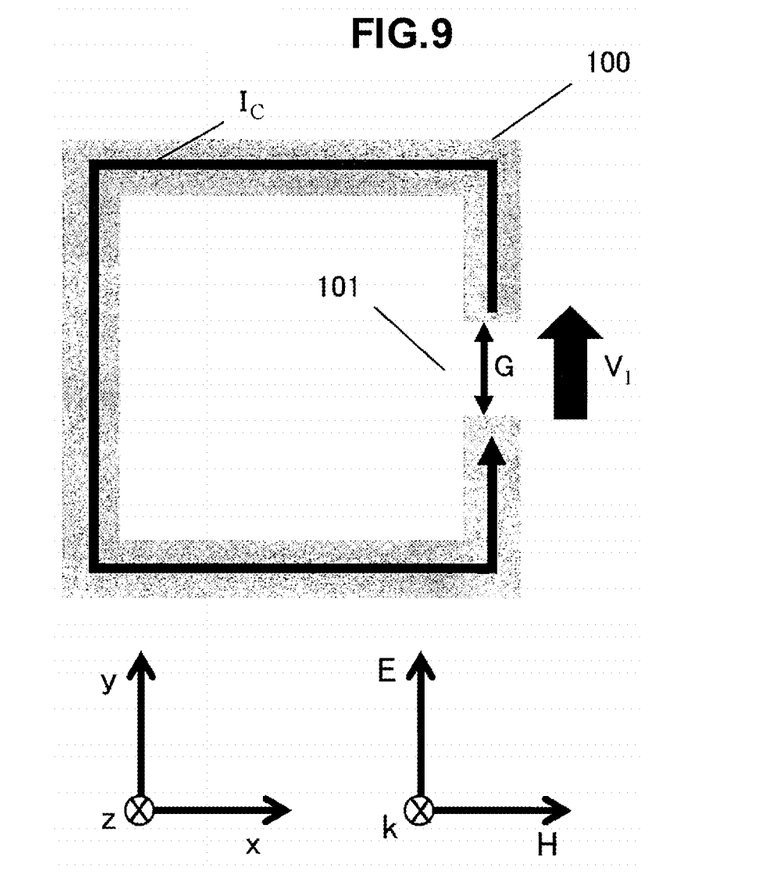
FIG. 9 is a plan view showing the structure of a related split ring resonator.

FIG. 9 shows the structure of a related representative split ring resonator. The split ring resonator includes a conductor 100 made of a metal, and a gap 101 formed in the conductor 100. An incident electromagnetic wave having an electric field component in a y-axis direction parallel to the gap 101 excites and generates an electromotive force in the gap 101 to generate a circulating current $I_c$. The circulating current $I_c$ becomes the maximum at an LC resonance frequency determined based on a capacitance component and inductive component derived from the gap 101 and conductor 100.

When shifting the resonance frequency by changing a dimension G of the gap 101, the capacitance component decreases as the dimension G becomes larger, and thus the resonance frequency becomes higher, and an electromotive force $V_1$ excited by the incident electromagnetic wave becomes greater. Conversely, the capacitance component increases as the dimension G of the gap 101 becomes smaller and thus the resonance frequency becomes lower, and the electromotive force $V_1$ excited by the incident electromagnetic wave becomes less.

Figure 10:
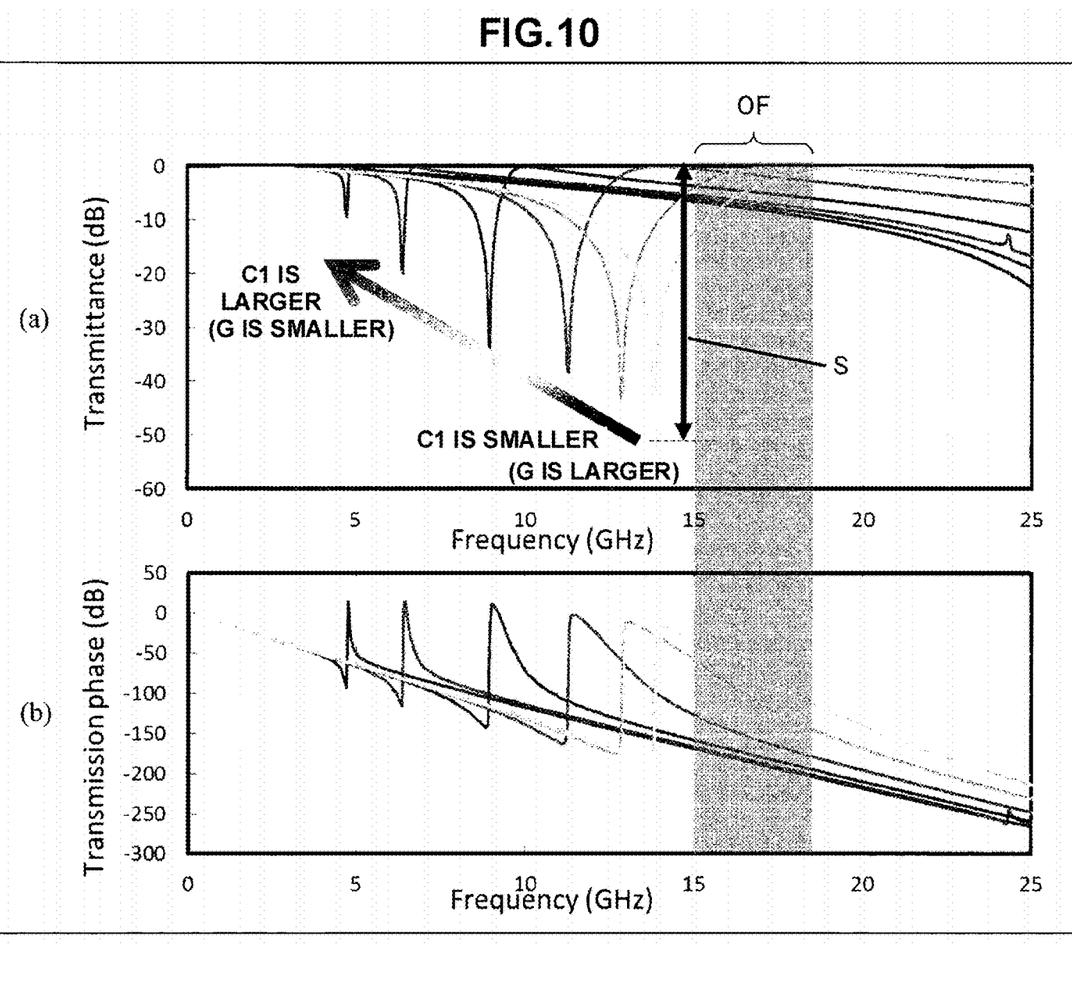
FIG. 10 shows graphs of the transmission characteristic of the related split ring resonator.

As shown in (a) of FIG. 10, a characteristic is obtained in which the higher the resonance peak intensity (resonance intensity S) and the lower the electromagnetic wave transmittance (Transmittance) becomes, as the dimension G of the gap 101 of a split ring resonator becomes larger, the higher resonance frequency (Frequency), and a lower capacitance $C_1$ of the gap 101. In this regard, as shown in (b) of FIG. 10, with respect to the characteristic of a transmission phase amount (Transmission phase), a split ring resonator with a higher resonance frequency exhibits a larger phase-change characteristic. Therefore, when an operating frequency OF is set in a frequency region that has higher frequencies than the resonance frequency and has a small loss, a wide band characteristic is obtained in which the transmission phase amount distribution remains unchanged even if the frequency is changed.

As described above, by utilizing the method of shifting the resonance frequency of the split ring resonator by changing the dimension G of the gap 101 of the split ring resonator, in the frequency region that has higher frequencies than the resonance frequency and has a small loss, a characteristic is obtained in which the changes in transmission phase amount caused by the change in frequency becomes less, and thus a wide band characteristic of 15% or higher can in principle be implemented in non-patent literature 2.

A metamaterial device using a unit cell having a wide band characteristic of 15% or higher can be used as a condenser/deflection lens in a wireless system in which a fractional bandwidth of about 10% is generally required.

On the other hand, when utilizing a unit cell structure in which the transmission phase amount characteristic strongly depends on an incident electromagnetic wave frequency, a frequency-sweep-type beam steerer with deflection angles that change in accordance with the incident electromagnetic frequency like a prism can be implemented, thereby applicable to a system such as a radar and imaging. However, in the similar unit cell shown in FIG. 9, the resonance intensity becomes higher as the dimension G of the gap 101 becomes larger, and thus, in principle, a transmission phase amount characteristic in a wide band of about 15% is obtained. Therefore, when utilizing a metamaterial device that employs the similar unit cell to serve as a frequency sweep beam steerer, a frequency sweep of at least 15% or more is needed.

Related Art Literature

Non-Patent Literature

Non-Patent Literature 1: W. Shin, et. al., "A 108-112 GHz 4×4 Wafer-Scale Phased Array Transmitter with High-Efficiency On-Chip Antennas", IEEE JOURNAL OF SOLID-STATE CIRCUITS, Vol. 48, No. 9, pp. 2041-2055, 2013

Non-Patent Literature 2: D. Kitayama, et. al., "Laminated metamaterial flat lens at millimeter-wave frequencies", OPTICS EXPRESS, Vol. 23, No. 18, 2015

DISCLOSURE OF INVENTION

Problem to be Solved by the Invention

The present invention has been made in consideration of the above problem, and has as its object to provide a passive element capable of changing the transmission phase amount of an incident electromagnetic wave in a narrow band.

Means of Solution to the Problem

According to the present invention, there is provided a passive element including a first conductor made of a metal and having an annular shape split by a first gap and a second gap that is different from the first gap, wherein a first capacitance generated by the first gap is different from a second capacitance generated by the second gap.

According to the present invention, there is also provided a passive element including a first conductor made of a metal and having an annular shape split by one of a first gap and a second gap that is different from the first gap, and a second conductor made of a metal and formed so as to be connected to a plurality of points in the first conductor in a space surrounded by the first conductor, wherein the second conductor is split by a gap that is one of the first gap and the second gap not being formed in the first conductor, and a first capacitance generated by the first gap is different from a second capacitance generated by the second gap.

Effect of the Invention

According to the present invention, in a passive element including a conductor and a first gap, it is possible to change the transmission phase amount of an electromagnetic wave in a narrow band by adding a second gap. It is also possible to implement a passive element that does not serve as the scattering source of an incident electromagnetic field by drastically decreasing the resonance intensity of the element.

BEST MODE FOR CARRYING OUT THE INVENTION

Principle of Invention

Figure 1:
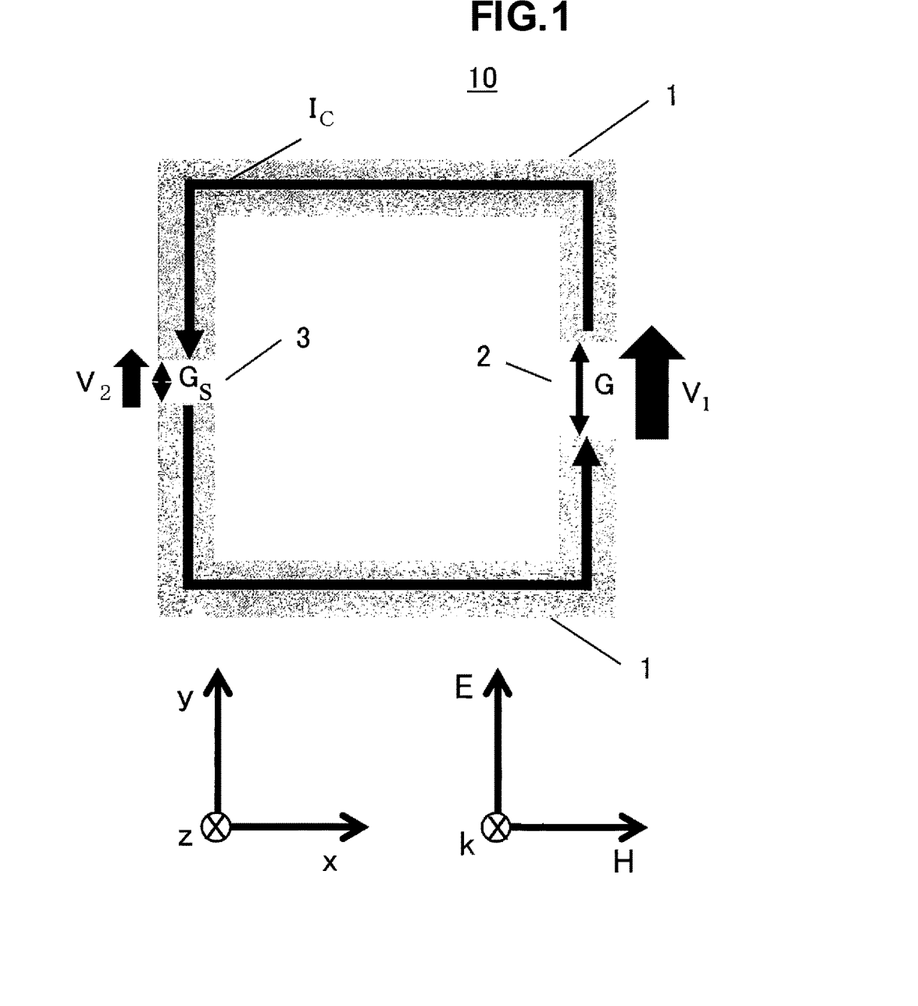
FIG. 1 is a plan view showing the structure of a split ring resonator according to the first embodiment of the present invention.

FIG. 1 is a plan view showing the structure of a split ring resonator according to the first embodiment of the present invention. The principle of the present invention will be described with reference to FIG. 1. A split ring resonator 10 according to the present invention includes a conductor 1 having a split annular shape and made of a metal, and a first gap 2 formed in the conductor 1. Furthermore, the split ring resonator 10 according to the present invention is provided with, in a path of a circulating current $I_c$ caused by an electromotive force excited and generated in the first gap 2 by an external electric field (incident electromagnetic wave), one or more second gaps 3 for exciting an electromotive force in a direction opposite to that of the electromotive force in the first gap 2. Referring to FIG. 1, x, y, and z respectively represent coordinate axes, H represents the direction of a magnetic field, E represents the direction of an electric field, and k represents the direction of a wave number.

Figure 2:
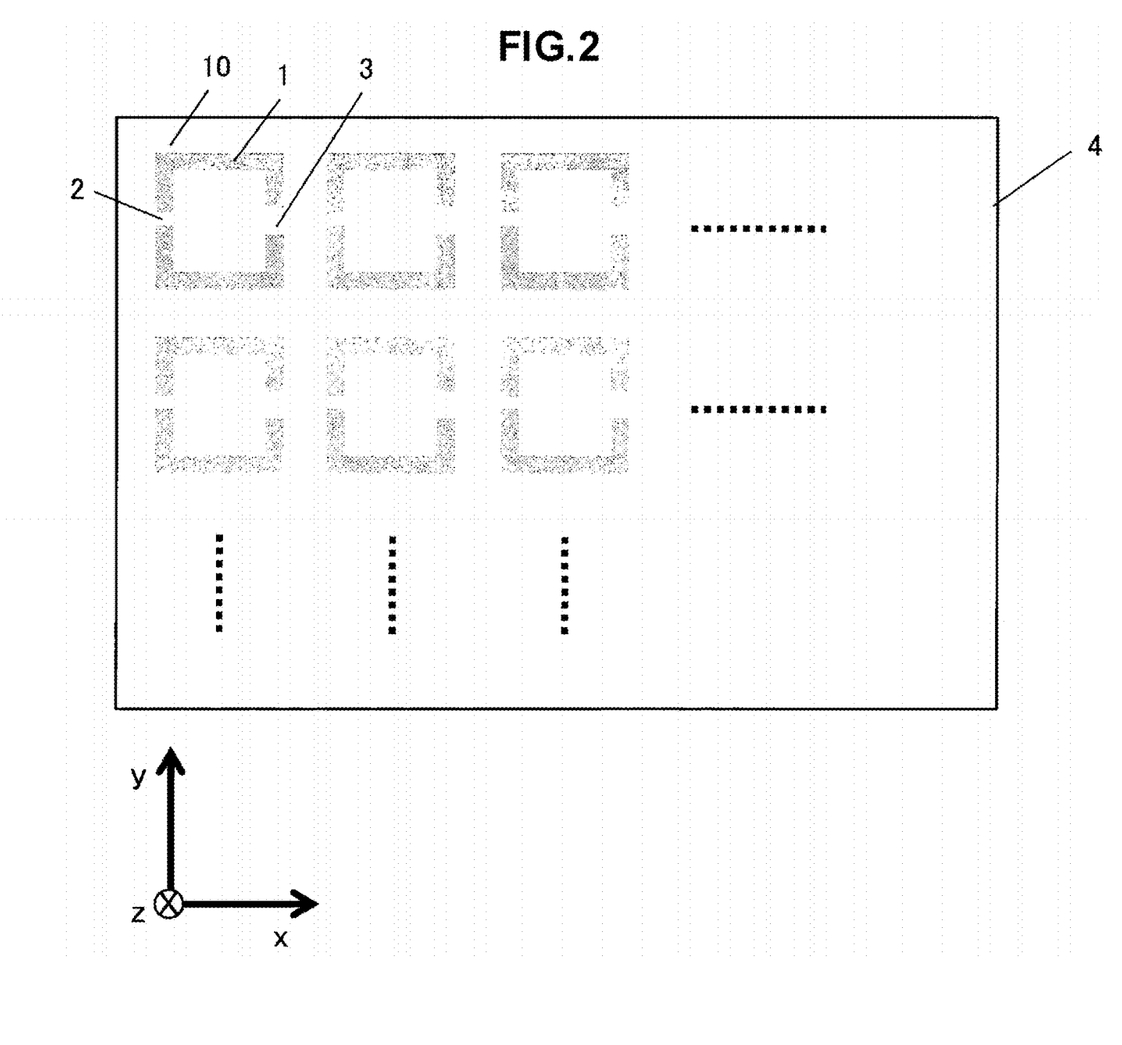
FIG. 2 is a plan view showing a structure in which split ring resonators are arranged in an array.

According to the present invention, as shown in FIG. 2, the split ring resonators 10 (unit cells) shown in FIG. 1 are periodically formed, for example, in an array on a dielectric substrate 4 formed from a dielectric body. Here, the plurality of split ring resonators 10 are arranged on the dielectric substrate 4 so that a capacitance component $C_2$ generated by the second gap 3 becomes smaller than a capacitance component $C_1$ generated by the first gap 2 (for example, a dimension $G_s$ of the second gap 3 is larger than a dimension G of the first gap 2).

Alternatively, the plurality of split ring resonators 10 are arranged on the dielectric substrate 4 so that the capacitance component $C_2$ generated by the second gap 3 becomes larger than the capacitance component $C_1$ generated by the first gap 2 (for example, the dimension $G_s$ of the second gap 3 is smaller than the dimension G of the first gap 2).

According to the present invention, since the split ring resonator 10 is formed by a metallic pattern, the split ring resonators 10 arranged in an array can be formed in a multilayered structure (the split ring resonators 10 can be formed in a multilayered structure by setting, as a stack-growth direction, a z-axis direction in FIGS. 1 and 2).

According to the present invention, it is possible to implement, by creating a metallic pattern, a flat device capable of obtaining the following effects.

(I) In the present invention, a frequency region can be formed in which the resonance intensity becomes weaker as the dimension G of the first gap 2 becomes larger, and the phase amount characteristic can be changed in a narrow band (a phase amount changes even if a frequency sweep in a narrow band is used). Furthermore, by more drastically decreasing the resonance intensity, it is possible to implement a metallic pattern that does not become the scattering source of an incident electromagnetic field.

(II) In the present invention, it is possible to implement a characteristic in which a spatial phase amount distribution strongly depends on the frequency of an incident electromagnetic wave by setting an operating frequency in a frequency region with higher frequencies than a resonance frequency. When a deflection type phase amount distribution given by equation (1) is formed at the operating frequency, the deflection angle of a transmitted wave can be changed by shifting an incident electromagnetic wave frequency from the operating frequency. In equation (1), φ(x, y) represents the phase amount, x represents the position of the split ring resonator 10 in the x-axis direction, θ represents the deflection angle of the electromagnetic wave transmitted through the split ring resonator 10, and λ represents a wavelength at the operating frequency.

$$\varphi(x, y) = \frac{2\pi x}{\lambda}\sin\theta \quad (1)$$

When a lens-type phase amount distribution given by equation (2) is formed at the operating frequency, a focal length and a transmission beam width can be changed by shifting the input electromagnetic wave frequency from the operating frequency. In equation (2), y represents the position of the split ring resonator 10 in the y-axis direction and $f_0$ represents the focal length of a lens.

$$\varphi(x, y) = \frac{2\pi\left(\sqrt{f_0^2 + x^2 + y^2} - f_0\right)}{\lambda} \quad (2)$$

(III) In the present invention, it is possible to implement a characteristic in which the incident electromagnetic wave frequency dependency of the spatial phase amount distribution is weak, by setting the operating frequency in the frequency region with higher frequencies than the resonance frequency. When the deflection type phase amount distribution given by equation (1) is formed at the operating frequency, it is possible to implement a characteristic in which the incident electromagnetic wave dependency of the deflection angle of the transmitted wave is weak. When a lens type phase amount distribution given by equation (2) is formed at the operating frequency, it is possible to implement a characteristic in which the incident electromagnetic wave dependency of the focal length and beam width is weak.

(IV) In the present invention, it is possible to change a change amount by the frequency sweep of the transmitted electromagnetic wave propagation characteristic in accordance with the number of layers of the multilayered structure of the split ring resonators 10.

Note that the conductor having the split annular shape according to the present invention may be a conductor split into a plurality of pieces, or an integrated conductor with a gap at only one position, as will be described later.

First Embodiment

An embodiment of the present invention will be described below with reference to the accompanying drawings. FIG. 1 is a plan view showing a split ring resonator serving as a unit cell of a metamaterial passive element according to the embodiment.

The related split ring resonator shown in FIG. 9 includes the conductor 100 and the gap 101. In this split ring resonator, the circulating current $I_c$ flows in the conductor 100 by the electromotive force $V_1$ excited and generated in the gap 101 by the external electric field, and the circulating current becomes the maximum when an electromagnetic wave of the LC resonance frequency enters.

In the structure of the related split ring resonator, as the dimension G of the gap 101 along the circumferential direction of the conductor 100 becomes larger, the capacitance component $C_1$ generated by the gap 101 decreases, and the resonance frequency becomes higher. Furthermore, since the electromotive force $V_1$ excited and generated in the gap 101 also becomes greater, the resonance intensity becomes higher as the resonance frequency becomes higher. Therefore, a phase amount difference at an operating frequency that allows a small loss extends in principle over a wide band.

On the other hand, in a split ring resonator 10 according to this embodiment shown in FIG. 1, a circulating current $I_c$ induced by an external electric field is determined by electromotive forces $V_1$ and $V_2$ respectively excited and generated in a first gap 2 and a second gap 3. The use of the electromotive force $V_2$ excited and generated in the second gap 3 allows to realize a characteristic which is different from the characteristic of the related technology, that is, the characteristic in which the weaker the resonance intensity, the higher the resonance frequency becomes, thereby changing the phase amount characteristic in a narrow band.

Now, a case in which a capacitance $C_2$ generated by the second gap 3 is being fixed is considered. When a capacitance $C_1$ generated by the first gap 2 gradually increases within a range smaller than that of $C_2$, the LC resonance frequency gradually decreases, the electromotive force $V_1$ excited and generated in the first gap 2 becomes closer to the electromotive force $V_2$ excited and generated in the second gap 3, and thus the resonance intensity becomes weaker. When satisfying $C_1=C_2$, the electromotive forces $V_1$ and $V_2$ respectively excited and generated in the first gap 2 and the second gap 3 are balanced with each other, and the circulating current $I_c$ stops flowing, thereby minimizing the resonance intensity.

As the capacitance $C_1$ increases, the LC resonance frequency decreases. However, since the electromotive force $V_1$ excited and generated in the first gap 2 also becomes smaller, the electromotive force $V_2$ excited and generated in the second gap 3 becomes greater than the electromotive force $V_1$, thereby inducing the circulating current $I_c$. In a region where $C_1>C_2$, it is possible to realize a transmission characteristic in which the weaker the resonance intensity, the higher the resonance frequency. This cannot be obtained by the similar split ring resonator. The frequency characteristic of the resonance intensity is directly reflected on that of the transmission phase amount, thereby allowing a characteristic in which the transmission phase amount is changed in a narrow band in a frequency region with slightly higher frequencies than the resonance frequency.

Figure 3:
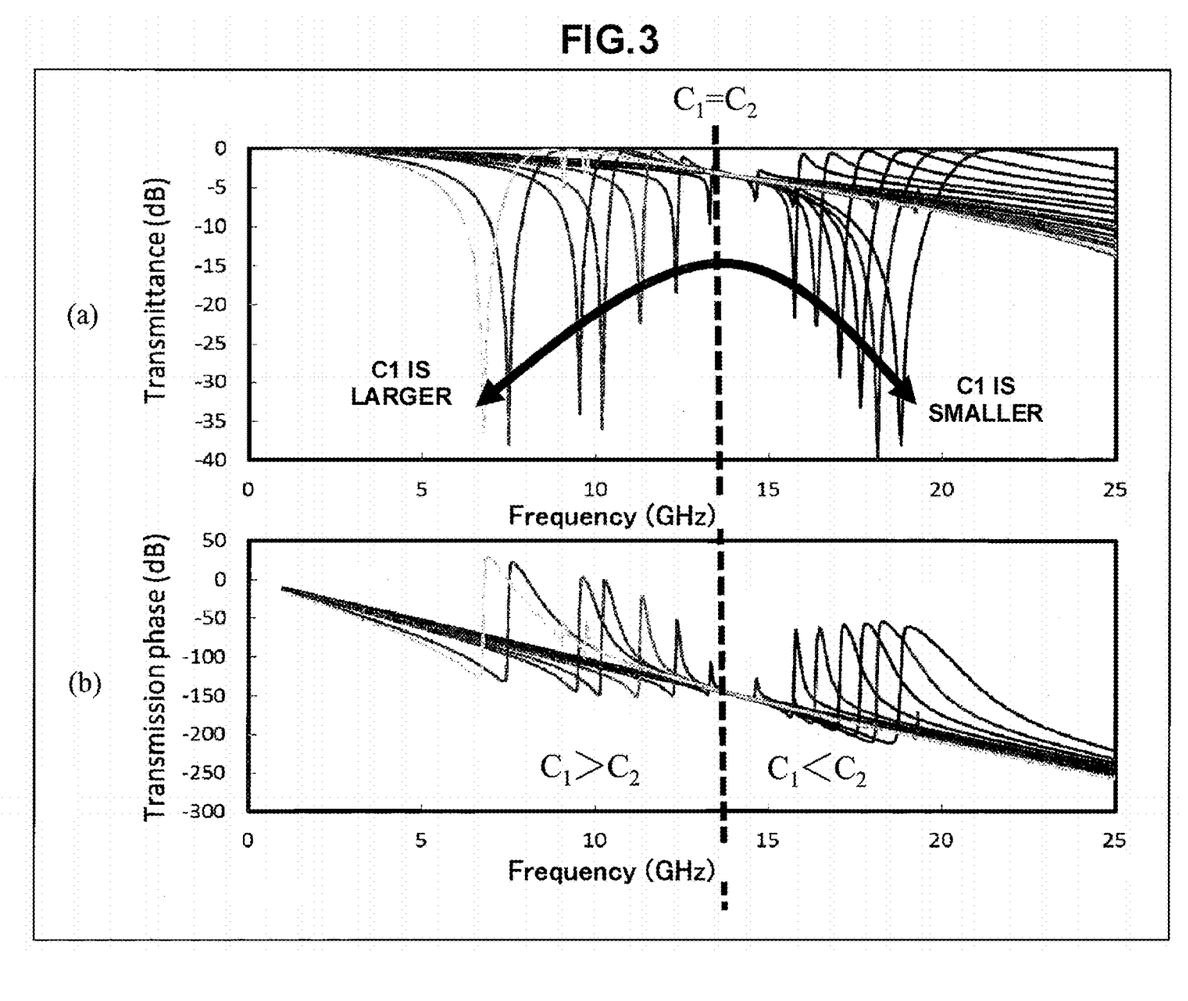
FIG. 3 shows graphs of the transmission characteristic of the split ring resonator according to the first embodiment of the present invention.

In FIG. 3, (a) shows a result of calculating the electromagnetic wave transmittance (Transmittance) of the split ring resonator according to this embodiment by an electromagnetic field simulation, and (b) shows a result obtained by calculating the electromagnetic wave transmission phase amount (Transmission phase) of the split ring resonator according to this embodiment. In this simulation, a split ring resonator 10A having a structure shown in FIG. 4A, that is a practical example of the split ring resonator according to this embodiment, is used.

Figure 4A:
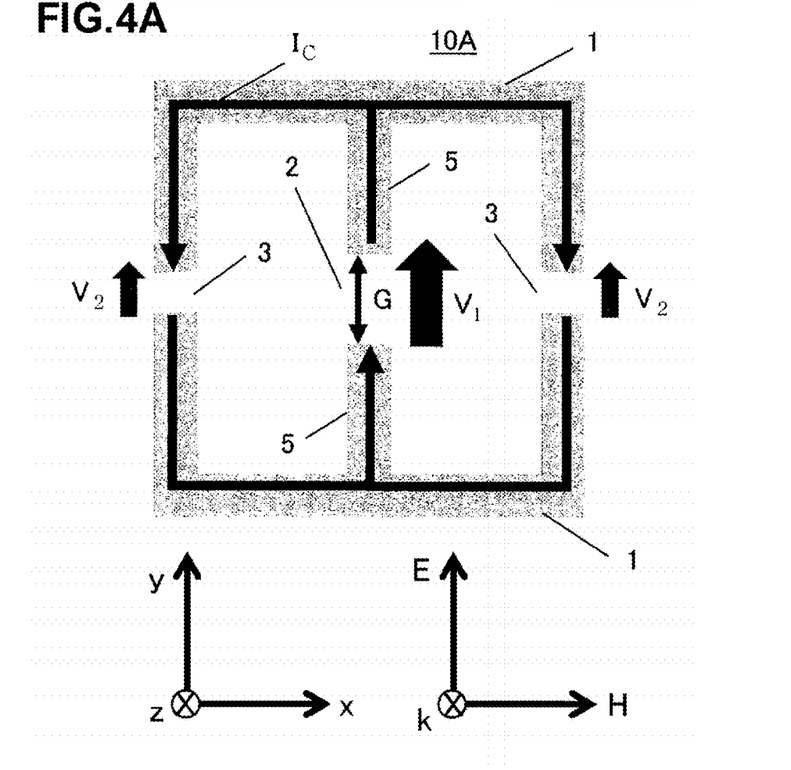
FIGS. 4A and 4B are plan views each showing the structure of a split ring resonator used in an electromagnetic field simulation.

The split ring resonator 10A shown in FIG. 4A includes a conductor 1 made of a metal having a split annular shape, a conductor 5 made of a metal and formed so as to be connected to a plurality of points (in this example, two points) in the conductor 1 in a space surrounded by the conductor 1, a first gap 2 formed in the conductor 5, and two second gaps 3 formed in the conductor 1. In this example, the transmittance and transmission phase amount characteristic are calculated when a plane wave enters in a direction perpendicular to a flat surface on which the split ring resonators 10A of the same pattern are two-dimensionally, infinitely, and periodically arranged, similarly to FIG. 2.

The structure shown in FIG. 4A indicates a split ring resonator having a structure symmetrical with respect to the electric field surface of the incident electromagnetic wave, in which the opposite circulating currents $I_c$ of the same magnitude flow to the right and left sides of the conductor 1 split into two parts by the conductor 5 connecting the two points of the conductor 1, and thus a magnetic response is canceled.

Figure 4B:
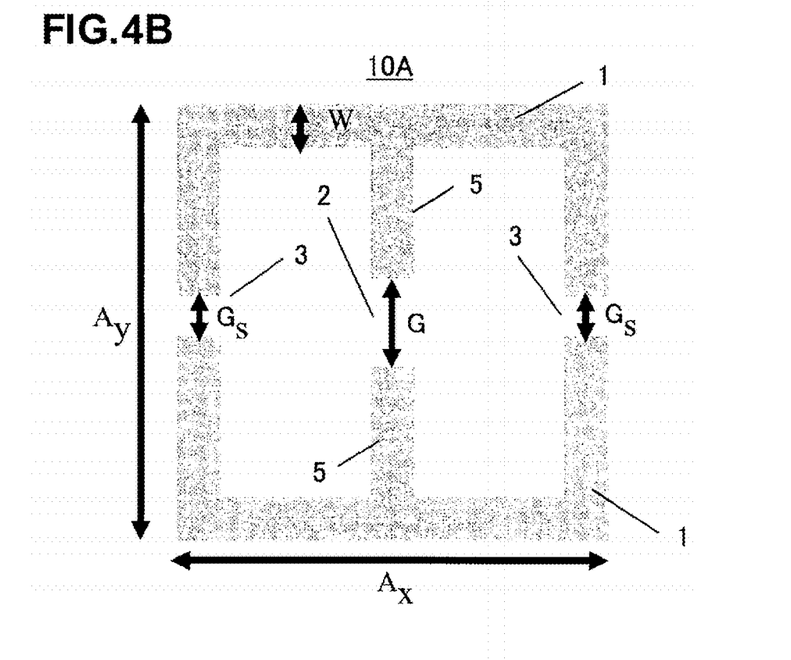

As shown in FIG. 4B, the outer diameters in the x- and y-axis directions of the conductor 1, the width of the conductor 1, and the dimension of the second gap 3 are represented by $A_x$, $A_y$, W, and $G_s$, respectively, and $A_x$=5 mm, $A_y$=5 mm, W=0.5 mm, and $G_s$=0.05 mm are set. Periods in the x- and y-axis directions at which the split ring resonators 10A are arranged are set to 5.5 mm, and the value of the capacitance $C_1$ generated in the first gap 2 with the dimension G=1 mm is changed within the range of 0 to 4 pF. As shown in (a) and (b) of FIG. 3, it is understood that $C_1$>$C_2$ is satisfied in a frequency region with frequencies lower than about 14 GHz, and a characteristic is obtained in which the weaker the resonance intensity, the higher the resonance frequency becomes in the frequency region (a narrow band characteristic at the operating frequency). In contrast, when $C_1$<$C_2$ is satisfied in a frequency region with frequencies higher than 14 GHz, the characteristic is obtained in which the stronger the resonance, the higher the resonance frequency becomes in such frequency region (a wide band characteristic at the operating frequency).

Based on the above description, consider, for example, a case in which the split ring resonators 10A according to this embodiment are arranged two-dimensionally on the dielectric substrate so as to form the transmission phase amount distribution given by equation (1). FIGS. 5A to 5D are views for explaining a concept of deflection angle control of the electromagnetic wave by a frequency sweep when $C_1$<$C_2$ in the split ring resonator 10A according to this embodiment.

Figure 5A:
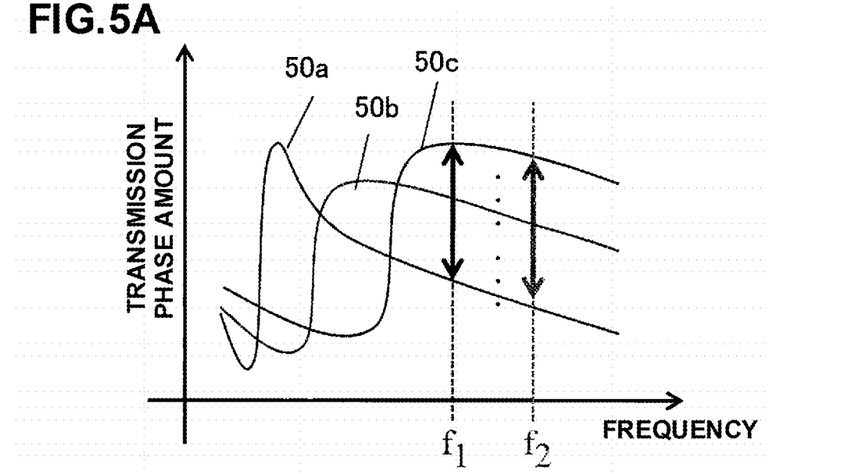
FIGS. 5A to 5D are views for explaining a concept of deflection angle control of an electromagnetic wave by a frequency sweep.
Figure 5B:
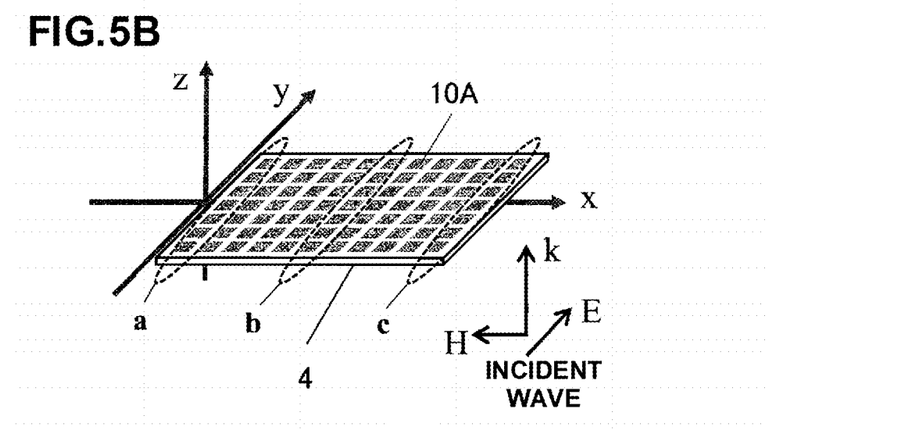

As shown in FIG. 5B, the split ring resonators 10A of this embodiment which satisfy the condition of $C_1$<$C_2$, are arranged two-dimensionally on the dielectric substrate 4 formed from the dielectric body. Here, for the split ring resonators 10A in a region a of FIG. 5B, the structure of the split ring resonators 10A is set to have a transmission phase amount indicated by 50a in FIG. 5A. For the split ring resonators 10A in a region b of FIG. 5B, the structure of the split ring resonators 10A is set to have a transmission phase amount indicated by 50b in FIG. 5A. For the split ring resonators 10A in a region c of FIG. 5B, the structure of the split ring resonators 10A is set to have a transmission phase amount indicated by 50c in FIG. 5A.

Figure 5C:
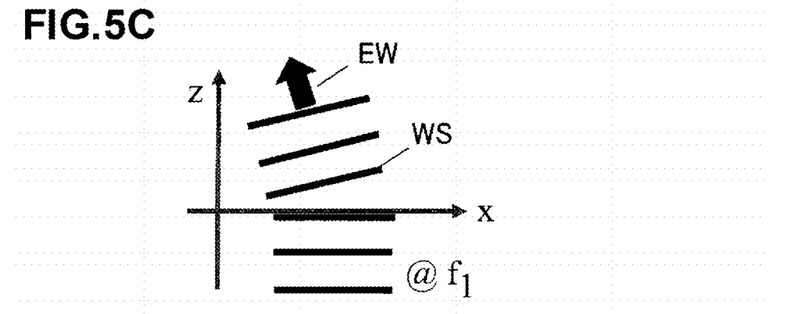
Figure 5D:
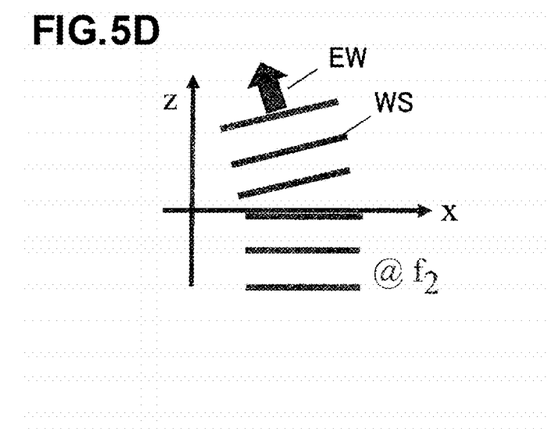

As described above, by setting $C_1$<$C_2$, and setting operating frequencies $f_1$ and $f_2$ in the frequency region with higher frequencies than the resonance frequency, it is possible to obtain a metamaterial device in which the transmission phase amount distribution of the incident electromagnetic wave within the region of the operating frequencies $f_1$ and $f_2$, that is, the deflection angle of a transmitted wave hardly depends on the frequency of an incident electromagnetic wave. FIG. 5C shows a state in which a wave front WS of an incident electromagnetic wave at the operating frequency $f_1$ deflects, and FIG. 5D shows a state in which a wave front WS of an incident electromagnetic wave at the operating frequency $f_2$ deflects. An arrow EW in each of FIGS. 5C and 5D indicates the propagation direction of the electromagnetic wave.

Figure 6A:
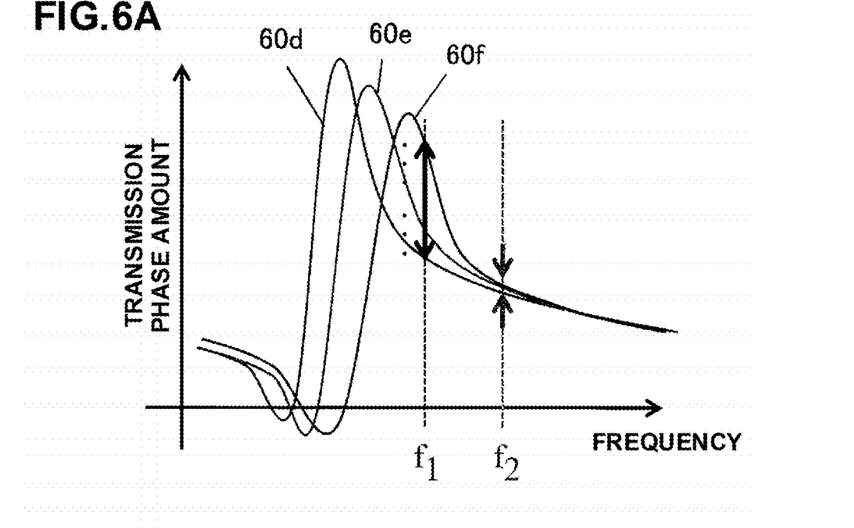
FIGS. 6A to 6D are views for explaining a concept of deflection angle control of an electromagnetic wave by a frequency sweep.
Figure 6B:
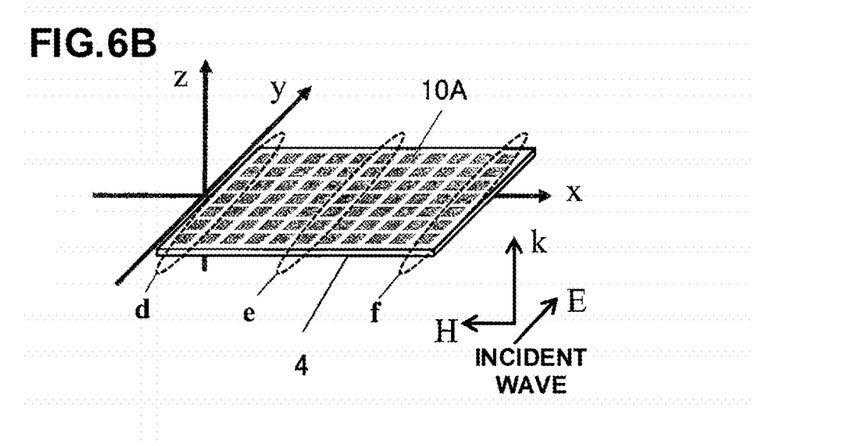

On the other hand, FIGS. 6A to 6D are views for explaining a concept of deflection angle control of the electromagnetic wave by a frequency sweep when $C_1$>$C_2$ in the split ring resonator 10A according to this embodiment. Similarly to the case in FIG. 5B, the split ring resonators 10A of this embodiment which satisfy the condition of $C_1$>$C_2$, are arranged two-dimensionally on the dielectric substrate 4 formed from the dielectric body (FIG. 6B). Here, for the split ring resonators 10A in a region d of FIG. 6B, the structure of the split ring resonators 10A is set to have a transmission phase amount indicated by 60d in FIG. 6A. For the split ring resonators 10A in a region e of FIG. 6B, the structure of the split ring resonators 10A is set to have a transmission phase amount indicated by 60e in FIG. 6A. For the split ring resonators 10A in a region f of FIG. 6B, the structure of the split ring resonators 10A is set to have a transmission phase amount indicated by 60f in FIG. 6A.

Figure 6C:
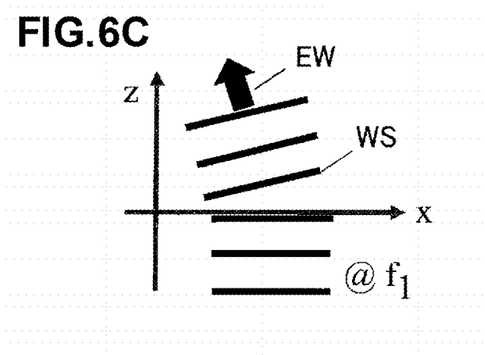
Figure 6D:
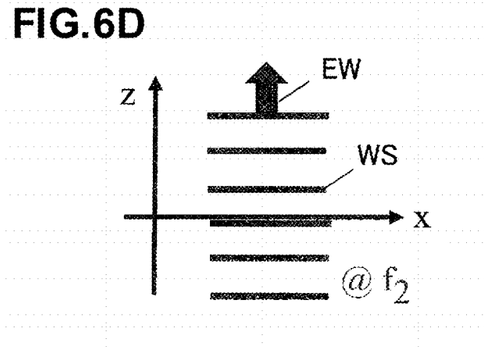

As described above, by setting $C_1$>$C_2$, and setting the operating frequencies $f_1$ and $f_2$ in the frequency region with higher frequencies than the resonance frequency, it is possible to obtain a metamaterial device in which the transmission phase amount distribution of the incident electromagnetic wave within the region of the operating frequencies $f_1$ and $f_2$, that is, the deflection angle of a transmitted wave depends on the frequency of the incident electromagnetic wave. FIG. 6C shows a state in which the wave front of an incident electromagnetic wave at the operating frequency $f_1$ deflects, and FIG. 6D shows a state in which the wave front of an incident electromagnetic wave at the operating frequency $f_2$ does not deflect. The split ring resonator 10A that satisfies the condition of $C_1$>$C_2$ can be used as a device for implementing beam steering by a frequency sweep in the imaging or radar system application.

Note that the characteristics of the split ring resonator 10A have been described with reference to FIGS. 3, 5A to 5D, and 6A to 6D. However, the split ring resonator 10 as the basic form of this embodiment can obtain the same characteristics.

Second Embodiment

As the structure of the split ring resonator according to the present invention, it is only necessary to adopt a structure obtained by adding the second gap 3 to the path of the circulating current $I_c$ induced by the external electric field in the metallic ring structure including the first gap 2. Each of the structures shown in FIGS. 1, 4A, and 4B is a structure in which the polarized wave dependency of the incident electromagnetic wave is strong (that is, a structure in which a desired transmission characteristic is obtained when the direction of the polarized wave of the incident electromagnetic wave is a specific direction). However, the present invention is not limited to this.

Figure 7A:
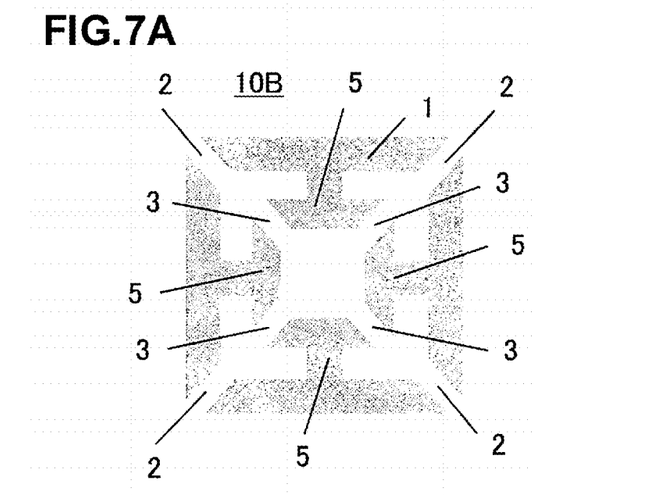
FIGS. 7A to 7E are plan views each showing the structure of a split ring resonator according to the second embodiment of the present invention.

FIGS. 7A to 7E are plan views each showing the structure of a split ring resonator according to the second embodiment of the present invention. A split ring resonator 10B shown in FIG. 7A is an example in which four first gaps 2 are formed in a conductor 1 having a rectangular shape in a planar view and four second gaps 3 are formed in a conductor 5 connected to four points of the conductor 1.

Figure 7B:
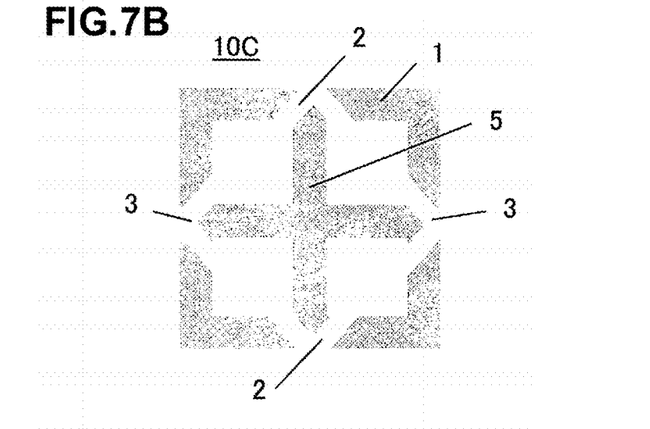

A split ring resonator 10C shown in FIG. 7B is an example in which a conductor 1 having a rectangular shape in a planar view and a conductor 5 formed to extend toward four points of the conductor 1 are provided, first gaps 2 are formed at two of four intersection points of the conductors 1 and 5, and second gaps 3 are formed at the remaining intersection points. Therefore, the first gaps 2 and the second gaps 3 split the conductor 1 while separating the conductors 1 and 5.

Figure 7C:
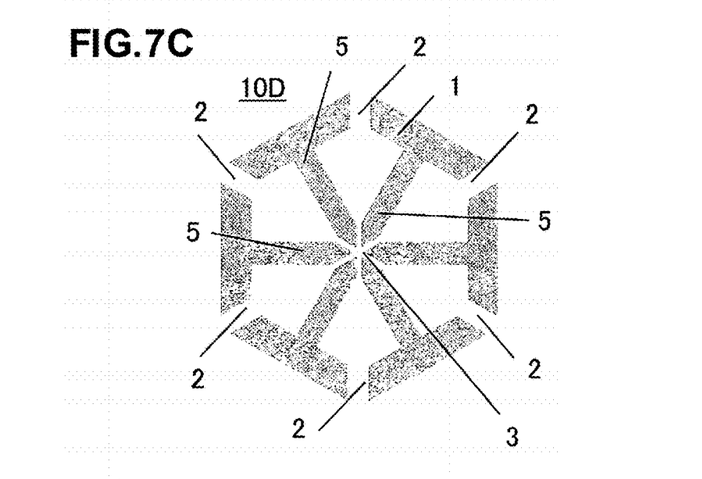
Figure 7D:
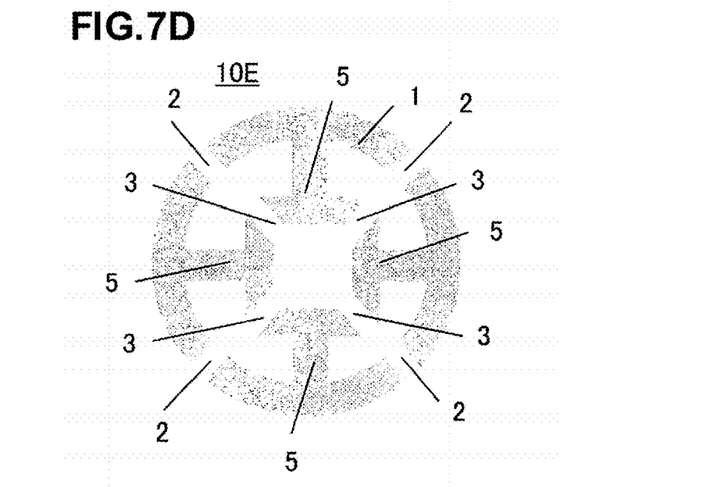
Figure 7E:
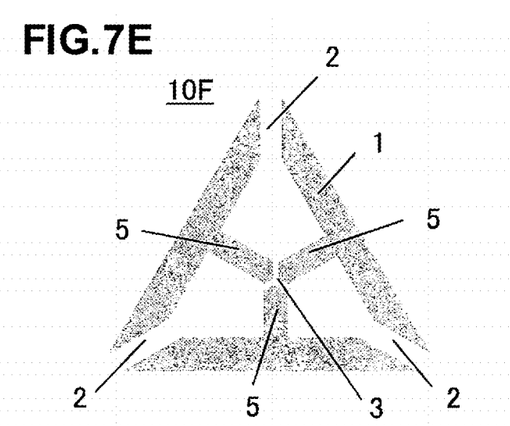

A split ring resonator 10D shown in FIG. 7C is an example in which six first gaps 2 are formed in a conductor 1 having a hexagonal shape in a planar view, and a second gap 3 is formed at the central portion of a conductor 5 connected to six points of the conductor 1. A split ring resonator 10E shown in FIG. 7D is an example in which four first gaps 2 are formed in a conductor 1 having a ring shape in a planar view, and four second gaps 3 are formed in a conductor 5 connected to four points of the conductor 1. A split ring resonator 10F shown in FIG. 7E is an example in which three first gaps 2 are formed in a conductor 1 having a triangular shape in a planar view, and a second gap 3 is formed at the central portion of a conductor 5 connected to three points of the conductor 1.

According to the above-described structures shown in FIGS. 7A to 7E, it is possible to implement a structure with weak polarized wave dependency such that the same shape is obtained even if the direction of the polarized wave is changed (that is, a structure in which a desired transmission characteristic can be obtained even if the direction of the polarized wave of the incident electromagnetic wave is changed).

Note that in FIGS. 1, 4A, 4B, and 7A to 7E, the positions of the first and second gaps 2 and 3 may be swapped. As described above, $C_1 < C_2$ or $C_1 > C_2$ may be set.

Third Embodiment

In the first and second embodiments, an explanation was made in which when the plurality of second gaps 3 exist, the capacitances $C_2$ generated by the second gaps 3 are equal to each other (the dimensions of the plurality of second gaps 3 are equal to each other). However, the capacitance generated by at least one of the plurality of second gaps 3 may be different from those generated by the remaining second gaps 3.

Figure 8A:
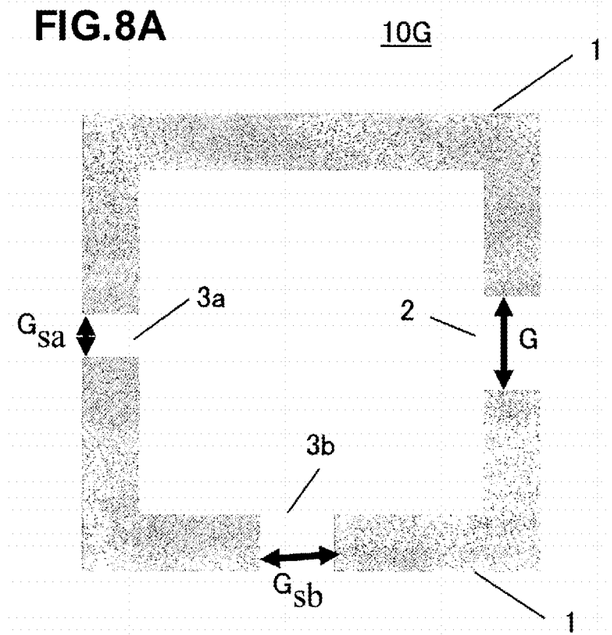
FIGS. 8A and 8B are plan views each showing the structure of a split ring resonator according to the third embodiment of the present invention.

FIGS. 8A and 8B are plan views each showing the structure of a split ring resonator according to the third embodiment of the present invention. A split ring resonator 10G shown in FIG. 8A is obtained by forming two second gaps 3a and 3b in the conductor 1 of the split ring resonator 10 shown in FIG. 1, and setting different dimensions as a dimension $G_{sa}$ of the second gap 3a and a dimension $G_{sb}$ of the second gap 3b to set different values of capacitances generated by the two second gaps 3a and 3b.

Figure 8B:
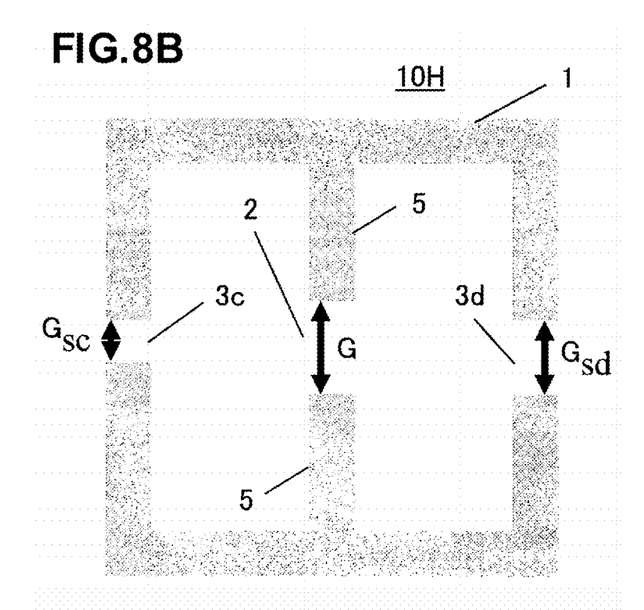

A split ring resonator 10H shown in FIG. 8B is obtained by forming two second gaps 3c and 3d in the conductor 1 of the split ring resonator 10A shown in FIG. 4A, and setting different dimensions as a dimension $G_{sc}$ of the second gap 3c and a dimension $G_{sd}$ of the second gap 3d to set different values of capacitances generated by the two second gaps 3c and 3d.

In each of the structures shown in FIGS. 8A and 8B, three or more second gaps 3 may be formed.

In each of the structures shown in FIGS. 7A to 7E, the capacitance generated by at least one of the plurality of second gaps 3 may be different from those generated by the remaining second gaps 3.

The unit cell (split ring resonator) of the passive element according to the present invention may have a rotationally symmetrical shape that overlaps the original shape when the unit cell is rotated within a plane including the conductor 1 and the first and second gaps 2 and 3 or a plane including the conductors 1 and 5 and first and second gaps 2 and 3. Furthermore, the unit cell of the passive element may have an axially symmetrical shape including a symmetry axis within the above-described plane or have a rotationally and axially symmetrical shape. The unit cell of the passive element may have an asymmetrical shape that does not overlap the original shape when the unit cell is rotated and include no symmetry axis of axial symmetry within the above-described plane.

In the unit cell (split ring resonator) of the passive element according to the present invention, the conductor 1 may or may not be split into a plurality of pieces by the first gap 2 or the second gap 3. For example, a structure in which one of the two left and right second gaps 3 in the structure of the conductor 1 shown in FIG. 4A is absent indicates an integrated conductor 1 including a chip by the second gap 3 in one portion of a rectangular shape in a planar view.

INDUSTRIAL APPLICABILITY

The present invention can be applied to a metamaterial passive element using a split ring resonator.

EXPLANATION OF THE REFERENCE NUMERALS AND SIGNS

1 . . . conductor, 2 . . . first gap, 3, 3a to 3d . . . second gap, 4 . . . dielectric substrate, 5 . . . conductor, 10, 10A to 10H . . . split ring resonator

The invention claimed is:

1. A passive element comprising:
   a first conductor made of a metal and having an annular shape split by a first gap and at least one second gap that is different from the first gap,
   a second conductor made of the metal and formed so as to extend toward a plurality of points in the first conductor in a space surrounded by the first conductor,
   wherein a first capacitance generated by the first gap is different from a second capacitance generated by the at least one second gap, and
   the first gap and the at least one second gap are formed at intersection points of the first conductor and the second conductor, and the first gap and the at least one second gap split the first conductor and separate the first conductor and the second conductor from each other.

2. The passive element according to claim 1, wherein
   the at least one second map comprises a plurality of second gaps; and
   the second capacitance generated by at least one of the plurality of second gaps is different from the second capacitances generated by the remaining second gaps.

3. The passive element according to claim 2, comprising:
   a plurality of unit cells each including the first conductor, the second conductor, the first gap, and the at least one second gap,
   wherein the plurality of unit cells are arranged in an array, and
   for each of the plurality of unit cells, a dimension of the first gap and a dimension of the at least one second gap are set to have a desired transmission phase amount with respect to an incident electromagnetic wave.

4. The passive element according to claim 3, wherein the plurality of unit cells are stacked one on another by setting, as a stack-growth direction, a direction perpendicular to a flat surface on which the first conductor is arranged.

5. The passive element according to claim 1, comprising:
   a plurality of unit cells each including the first conductor, the second conductor, the first gap, and the at least one second gap,
   wherein the plurality of unit cells are arranged in an array, and
   for each of the plurality of unit cells, a dimension of the first gap and a dimension of the at least one second gap are set to have a desired transmission phase amount with respect to an incident electromagnetic wave.

6. The passive element according to claim 5, wherein the plurality of unit cells are stacked one on another by setting, as a stack-growth direction, a direction perpendicular to a flat surface on which the first conductor is arranged.

7. The passive element according to claim 1, wherein the second capacitance generated by the at least one second gap is smaller than the first capacitance generated by the first gap.

8. The passive element according to claim 1, wherein the second capacitance generated by the at least one second gap is larger than the first capacitance generated by the first gap.

* * * * *